United States Patent
Ibata et al.

(10) Patent No.: US 6,534,842 B2
(45) Date of Patent: *Mar. 18, 2003

(54) COMPOSITE COMPONENTS AND THE METHOD OF MANUFACTURING THE SAME

(75) Inventors: Akihiko Ibata, Takaishi (JP); Michio Oba, Kadoma (JP)

(73) Assignee: Matsushita Electric Industrial Co., Ltd. (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/255,701

(22) Filed: Feb. 23, 1999

(65) Prior Publication Data

US 2002/0003281 A1 Jan. 10, 2002

(30) Foreign Application Priority Data

Mar. 3, 1998 (JP) ............................................ 10-050469

(51) Int. Cl.[7] ................................................ H01L 23/48
(52) U.S. Cl. ........................................ 257/531; 361/270
(58) Field of Search ................................ 257/531, 532, 257/533; 361/270

(56) References Cited

U.S. PATENT DOCUMENTS

| | | | | |
|---|---|---|---|---|
| 4,117,588 A | * | 10/1978 | Johnson | 29/608 |
| 4,342,143 A | * | 8/1982 | Jennings | 29/25.42 |
| 4,969,032 A | * | 11/1990 | Scheitlin et al. | 357/51 |
| 5,541,442 A | * | 7/1996 | Keil et al. | 257/533 |
| 5,635,669 A | * | 6/1997 | Kubota et al. | 174/52.1 |
| 5,717,243 A | * | 2/1998 | Lowther | 257/531 |
| 5,739,560 A | * | 4/1998 | Toyoda et al. | 257/211 |
| 5,786,979 A | * | 7/1998 | Douglass | 361/328 |
| 5,932,940 A | * | 8/1999 | Epstein et al. | 310/40 |
| 5,936,298 A | * | 8/1999 | Capocelli et al. | 257/531 |
| 5,994,759 A | * | 11/1999 | Darmawan et al. | 257/538 |
| 6,002,161 A | * | 12/1999 | Yamazaki | 257/531 |
| 6,124,624 A | * | 9/2000 | Van Roosmalen et al. | 257/531 |

FOREIGN PATENT DOCUMENTS

| | | |
|---|---|---|
| JP | 59-24534 | 6/1984 |
| JP | 62-28891 | 6/1987 |
| JP | 1-192107 | 8/1989 |

* cited by examiner

*Primary Examiner*—Lourdes Cruz
(74) *Attorney, Agent, or Firm*—Parkhurst & Wendel, L.L.P.

(57) ABSTRACT

A composite component of the invention has a structure of laminating a coil composed of at least one layer of conductor layer and at least one layer of insulator layer, and a capacitor composed of at least one layer of electrode layer and at least one layer of dielectric layer. And, it also includes, if necessary, an internal conductor for electrically connecting the coil and capacitor. Further, plural coil elements and capacitor elements are provided in a same layer. According to such constitution of the invention, composite components having various types of filter circuits can be manufactured easily by slight process condition changes. As a result, composite components for noise reduction can be mass produced efficiently, and a high productivity is obtained.

9 Claims, 5 Drawing Sheets

COMPOSITE COMPONENTS AND THE METHOD OF MANUFACTURING THE SAME

FIELD OF THE INVENTION

The present invention relates to the composite components for reducing noise used in various electronic appliances, communication devices or the like, and the method of manufacturing the same.

BACKGROUND OF THE INVENTION

Various composite components including coil, capacitor, resistor and others are widely used in electronic appliances, communication devices and others, and recently there is an increasing demand for smaller or thinner composite components. Besides, in the trend of higher frequency and digitization of circuits, the noise reducing function of composite components is being regarded with a greater importance.

Conventional examples of small or thin composite components having noise reducing function are disclosed in Japanese Patent Publication Nos. S59-24534 and S62-28891, in which a laminated coil and a multi layer ceramic capacitor are combined to form LC composite components. Structures of such LC composite components are proposed in various forms differing in the method of three-dimensional configuration of coil and capacitor as disclosed, for example, in Japanese Patent Publication No. S62-28891 and Japanese Laid-open Patent No. H1-192107.

Generally, a composite component for reduction of noise has an L-type, T-type, π-type or other type filter circuit combining plural coils and plural capacitors. However, structures of LC composite components proposed hitherto were structures capable of composing a circuit of only one type out of the many filter circuit. For example, the LC composite components disclosed in Japanese Patent Publication No. S62-28891 was capable of composing a T-type filter circuit alone.

In mass production of composite components, if composite components and its manufacturing processes capable of manufacturing all types of filter by slight change of manufacturing conditions are available, mass production of composite components is done efficiently, and a high productivity is expected. It is hence an object of the invention to provide LC composite components of a novel structure and a manufacturing method thereof, which is excellent in productivity and capable of freely forming many types of filter circuits by slight change of manufacturing process and manufacturing condition.

SUMMARY OF THE INVENTION

A composite part of the invention is composed of at least a pair of conductor layer and insulator layer, at least a pair of electrode layer and dielectric layer laminated with the insulator layer in-between. And an internal conductor for electrically connecting the conductor layer and electrode layer as required, and moreover the structure includes the terminals for connecting the electrode and the conductor composing the electric element inside made by lamination to an external electric circuit.

A manufacturing method of composite component of the invention comprises the steps of:

a) a step of manufacturing an insulator layer, b) a step of drilling, if necessary, a hole in the insulator layer, c) a step of forming a conductor layer on the drilled insulator layer or on the intact insulator layer, d) a step of manufacturing a dielectric layer, e) a step of drilling, if necessary, a hole in the dielectric layer, f) a step of forming the electrode layer on one side or both sides of the dielectric layer, g) a step of laminating a surface layer composed of insulator, a dielectric layer having at least one electrode layer, an intermediate layer composed of dielectrics or insulator, an insulator layer having at least one conductor layer, and a surface layer composed of insulator in this sequence, h) a step of sintering the laminate fabricated at step g), or a step of sintering the laminate after applying, if necessary, an electrode paste to the conductor layer and to the electrode layer exposing at the side of the laminate fabricated at step g).

i) a step of forming a terminal on the conductor layer and on the electrode layer exposing at the side of the laminate.

DESCRIPTION OF THE PREFERRED EMBODIMENTS

Referring now to the FIGS., preferred embodiments of the invention are described below.

FIRST EXEMPLARY EMBODIMENT

Figure 1:
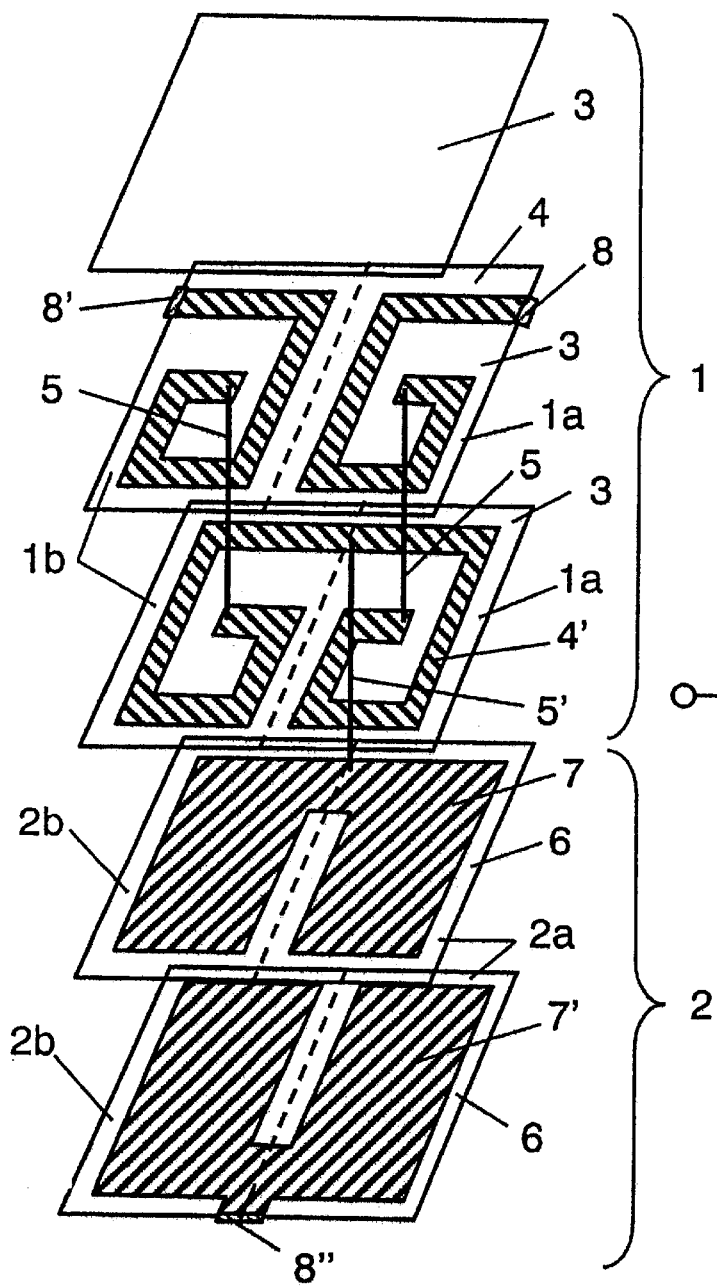
FIG. 1 is a schematic diagram showing a laminate structure of a composite component of the first embodiment of the invention.

FIG. 1 schematically shows a laminate structure of a composite component of a first embodiment of the invention. The composite component in FIG. 1 has a structure comprising a coil 1 laminated with a capacitor 2. Further, the composite component of the embodiment has three terminals 8, 8', 8" at the sides of the component.

The coil 1 has a structure where an insulator layer 3 is laminated with coil-form conductor layers 4, 4'. In FIG. 1, coil elements 1a, 1b are formed at right and left part of the component. The coil-form conductor layers 4, 4' are. connected with a conductor 5 through a through-hole of an insulator layer 3, and form a coil. That is, one coil element 1a is composed of two layers of conductor layers 4, 4', and the conductor 5 for connecting them.

Figure 2:
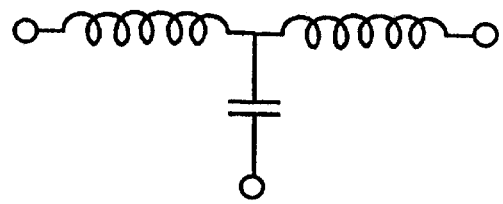
FIG. 2 is a diagram showing an equivalent circuit of the composite component of the first embodiment of the invention.

The capacitor 2 has a structure where a dielectric layer 6 is laminated with two electrode layers 7, 7'. In FIG. 1, capacitors 2a, 2b are formed at right and left part of the component. Further in FIG. 1, the conductor layer 4' comprising the coil and the electrode layer 7 comprising the capacitor are electrically connected by a conductor 5'. Moreover, the three terminals 8, 8', 8" are electrically connected to the two conductors 4 comprising the coil and the electrode 7' comprising the capacitor, respectively. Thus constituted composite component of the embodiment forms a T-type filter circuit as shown in an equivalent circuit in FIG. 2.

The materials used for the composite component of the present invention are described below.

The material of the insulator layer 3 may be either magnetic materials or nonmagnetic materials. Examples of nonmagnetic materials usable in the insulator layer 3 include epoxy resin/glass fiber composite, polyimide resin and other organic insulating material, such as glass, glass-ceramics composite, and various ceramic materials. As far as electric insulating property is sufficient, any material may be used in the insulator layer 3. When a nonmagnetic material is used in the insulator layer 3, the self resonance frequency of the coil 1 becomes higher.

Examples of magnetic materials usable in the insulator layer 3 include NiZn ferrite, NiZnCu ferrite, and other well-known materials having high magnetic permeability. By using such magnetic material having high magnetic permeability in the insulator layer 3, the inductance of the coil 1 can be increased.

As the materials for the conductor layers 4, 4' and electrode layers 7, 7', any good electric conductors may be used, and usually considering the price and other condition, it is preferred to use silver, silver-palladium alloy, copper and others.

The dielectric layer 6 may be composed of any known organic or inorganic dielectric material. By using a material having large dielectric constant in the dielectric layer 6, the capacitance of the capacitor 2 can be increased. Or, by varying the area of the electrode layers 7, 7' or by varying the thickness of the dielectric layer 6 comprising the capacitor 2, the capacitance of the capacitor 2 can be changed even in using the same materials.

The materials used for terminals 8, 8', 8" may be any conductive materials generally used for the terminals of electronic components. Generally, the material used for the terminals of electronic components is preferably comprised of plural layers, instead of a single material.

More specifically, the terminals of the composite components of the invention are composed of a base layer made of silver, silver-palladium alloy, copper or the like, a nickel plating layer, and an outer layer made of tin or its alloy. This composition is only an example, and other metals or organic materials, for example, conductive resin, may be selected as one of the constituent materials for the terminals 8, 8', 8".

As an example of use of the composite part of the invention, the composite part of the invention may be mounted on a ceramic substrate such as an alumina substrate or a ferrite substrate having wiring pattern formed preliminarily, using high temperature baking paste. In such a case, the materials of the terminals 8, 8', 8" are required to have a sufficient heat resistance for withstanding the baking temperature.

This embodiment of the invention shows the structure of a minimum required limit of a composite component of the invention. That is, in this constitution, by increasing the number of insulator layers 3 and conductor layers 4 comprising the coil 1, the number of turns of the coil 1 is increased, and the inductance can be increased. Similarly, by forming a laminate structure by repeating the combination of the dielectric layer 6 and electrode layers 7, 7' comprising the capacitor 2, the capacitance of the capacitor 2 can be increased. In this case, electrodes are alternately taken out from the electrode layers 7, 7', 7", 7''' and so on, and are connected to the conductor 5' and terminal 8" respectively.

Figure 3:
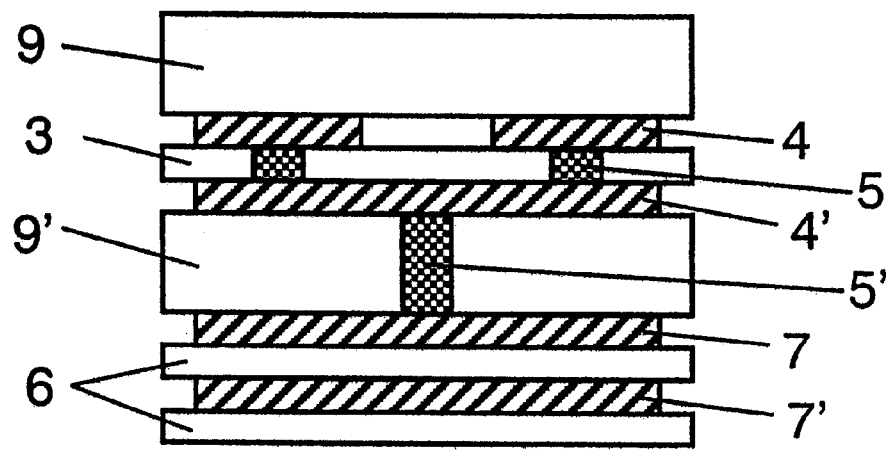
FIG. 3 is a cross-sectional view showing other laminate structure of the composite component of the first embodiment of the invention.
Figure 4:
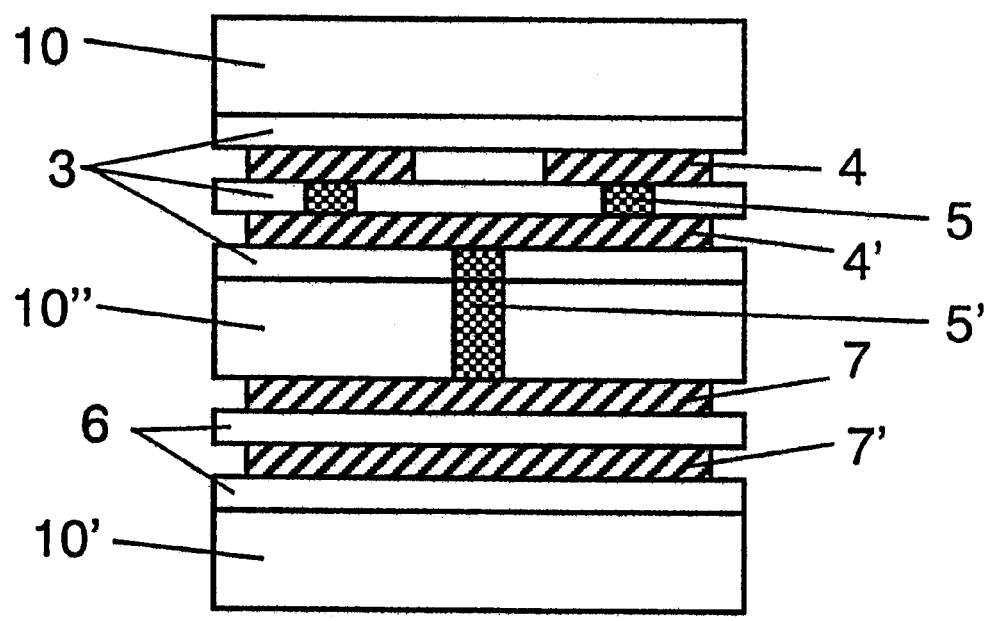
FIG. 4 is a cross-sectional view showing a different laminate structure of the composite component of the first embodiment of the invention.

Further, as shown in FIG. 3, in order to improve the electrical characteristic of the coil 1, the coil characteristic may be improved by laminating insulator layers 9, 9' made of magnetic materials on both upper and lower sides of the coil 1. Moreover, as shown in FIG. 4, for the purpose of decreasing or evading mutual interference of the coil and capacitor in the composite component, and also for the purpose of enhancing the mechanical strength or for adjusting the dimension in the thickness of the composite component, surface layers 10, 10' made of insulator or dielectrics, and/or an intermediate layer 10" made of insulator or dielectrics may be laminated on the upper and lower sides of the coil 1 or upper and lower sides of the capacitor 2.

When a thick insulator layer 9' or a intermediate layer 10" is inserted between the coil 1 and capacitor 2 for above mentioned purpose, sufficient cautions are required when a man form the conductor 5' for connecting the conductor layer 4' and the electrode layer 7. One example is to increase the diameter of the through-hole.

The filter cut-off frequency is known as important electric characteristics for LC composite components for noise reduction, in particular, T-type or $\pi$-type filter. The filter cut-off frequency is defined to be the frequency for obtaining a specified attenuation, and is determined by the inductance of the coil 1 and the capacitance of the capacitor 2. As understood from the description herein, since the inductance of the coil 1 and capacitance of the capacitor 2 can be easily changed, filters having the wide variety of cut-off frequency can be easily manufactured at the production of the composite components of the invention.

Moreover, in the composite component of the invention, since plural coils and plural capacitor elements are formed within a same laminate surface, unlike the conventional laminate type, the production is easy, and LC filters of various types can be manufactured only by slight changes in printing pattern and the like.

In the foregoing description, the composite component has a shape of surface mounting component having terminals directly on the side ends of the components, but instead of such terminals, the composite component of the invention may be also combined with lead wire connected to the pin terminals or caps.

The manufacturing method of composite component of the invention is described below.

The manufacturing method of composite component of the invention basically comprises the steps of:

a) a step of manufacturing an insulator layer,
b) a step of forming a conductor layer on the insulator layer,
c) a step of manufacturing a dielectric layer,
d) a step of forming an electrode layer on one side or both sides of the dielectric layer,
e) a step of laminating a surface layer comprised of insulator, a dielectric layer having the electrode layer, an intermediate layer comprised of dielectrics or insulator, an insulator layer having the conductor layer, and a surface layer comprised of insulator in this sequence, and
f) a step of forming terminals on the conductor layer and on the electrode layer exposing at the side of the laminate.

Moreover, for the purpose of increasing the impedance of the coil or the capacitance of the capacitor, other manufacturing method for manufacturing various kinds of filter circuits comprises the steps of:

a) a step of manufacturing an insulator layer,
b) a step of drilling, if necessary, a hole in the insulator layer,
c) a step of forming a conductor layer on the drilled insulator layer or on the intact insulator layer,
d) a step of manufacturing a dielectric layer,
e) a step of drilling, if necessary, a hole in the dielectric layer,
f) a step of forming the electrode layer on one side or both sides of the dielectric layer,
g) a step of laminating a surface layer composed of insulator, a dielectric layer having at least one electrode layer, an intermediate layer comprised of dielectrics or insulator, an insulator layer having at least one conductor layer, and a surface layer comprised of insulator in this sequence, and
h) a step of forming terminals on the conductor layer and on the electrode layer exposing at the side of the laminate.

As described in the above explanation, forming the surface layers on both surfaces of the composite components or placing an intermediate layer between the coil 1 and capacitor 2 is effective way for enhancing the coil characteristics. And, it is also effective for enhancing the mechanical characteristics of the composite components, and for adjusting the thickness of the composite components.

Furthermore, when the coil 1 or capacitor 2 is made of ceramic material, a sintering step is needed in addition to the above steps. In the case of the coil 1 and capacitor 2 are comprised of ceramic materials, a detailed method of manufacturing is described below.

The insulator layer 3 and dielectric layer 6 can be formed by green sheet forming method, printing method, dipping method, powder forming method, spin coating method, etc. The conductor layers 4, 4', electrode layers 7, 7', and terminals 8,8',8" are usually formed by printing method, but may also be formed by pattern forming method using laser, transfer method, dripping method, spray method, or other means.

The paste or slurry for forming each layer is prepared by mixing and dispersing powder having desired characteristics, sintering aids or inorganic binders, resin for binding, and, if necessary, plasticizers, dispersants and others, in a solvent.

The sintering temperature of the composite components is in a range of from 800 to 1300° C. The usable conductor material varies with the sintering temperature. For example, when silver is used as a conductor material, the maximum sintering temperature of the composite components is about 900° C. When silver-palladium alloy is used as a conductor material, the composite components can be sintered at 950° C. If it is necessary to bake the composite component at higher temperature, it is required to use nickel or palladium as the conductor material.

When manufacturing the composite components of the invention by using the above ceramic materials, the composite components may be sintered after laminating all constituent materials, or, the coil 1 and capacitor 2 may be laminated after separately sintering the coil 1 and capacitor 2.

Specific examples are described below.

EXAMPLE 1

First, ferrite slurry was manufactured by mixing and dispersing 100 g of NiZnCu ferrite powder, 8 g of butyral resin, 4 g of butyl benzyl phthalate, 24 g of methyl ethyl ketone, and 24 g of butyl acetate, in a pot mill.

The ferrite slurry was then applied on a PET film by using blade coater, and dried, and a ferrite green sheet of 0.2 mm in thickness was manufactured.

By a similar operation, using dielectric powder, a dielectric green sheet was manufactured.

A through-hole was opened in the ferrite green sheet by using a punching machine, and commercial silver paste was screen printed on the ferrite green sheet and dielectric green sheet, and conductor layers 4, 4' and electrode layers 7, 7' were formed. In this process, the silver paste was put into the through-hole opened in the green sheet, and a conductor 5 was formed.

The ferrite green sheet and dielectric green sheet having the conductor layers 4, 4' and electrode layers 7, 7' were laminated as shown in FIG. 1, and were heated and pressed at the condition of temperature of 100° C. and pressure of 500 kg/cm$^2$, to become a single structure.

Consequently, silver paste for terminals was applied on the exposed portions of the conductor layers 4, 4' and electrode layers 7, 7', and sintered for 2 hours at 900° C., and a composite element was manufactured. The obtained composite element was free from delamination, crack, warp or other defect.

The terminals of the obtained composite element were plated with nickel and tin by ordinary barrel plating method, and a composite component was completed. The electric characteristics of the composite component were measured by using impedance analyzer and network analyzer, and excellent electric characteristics were obtained.

Second Exemplary Embodiment

Figure 5:
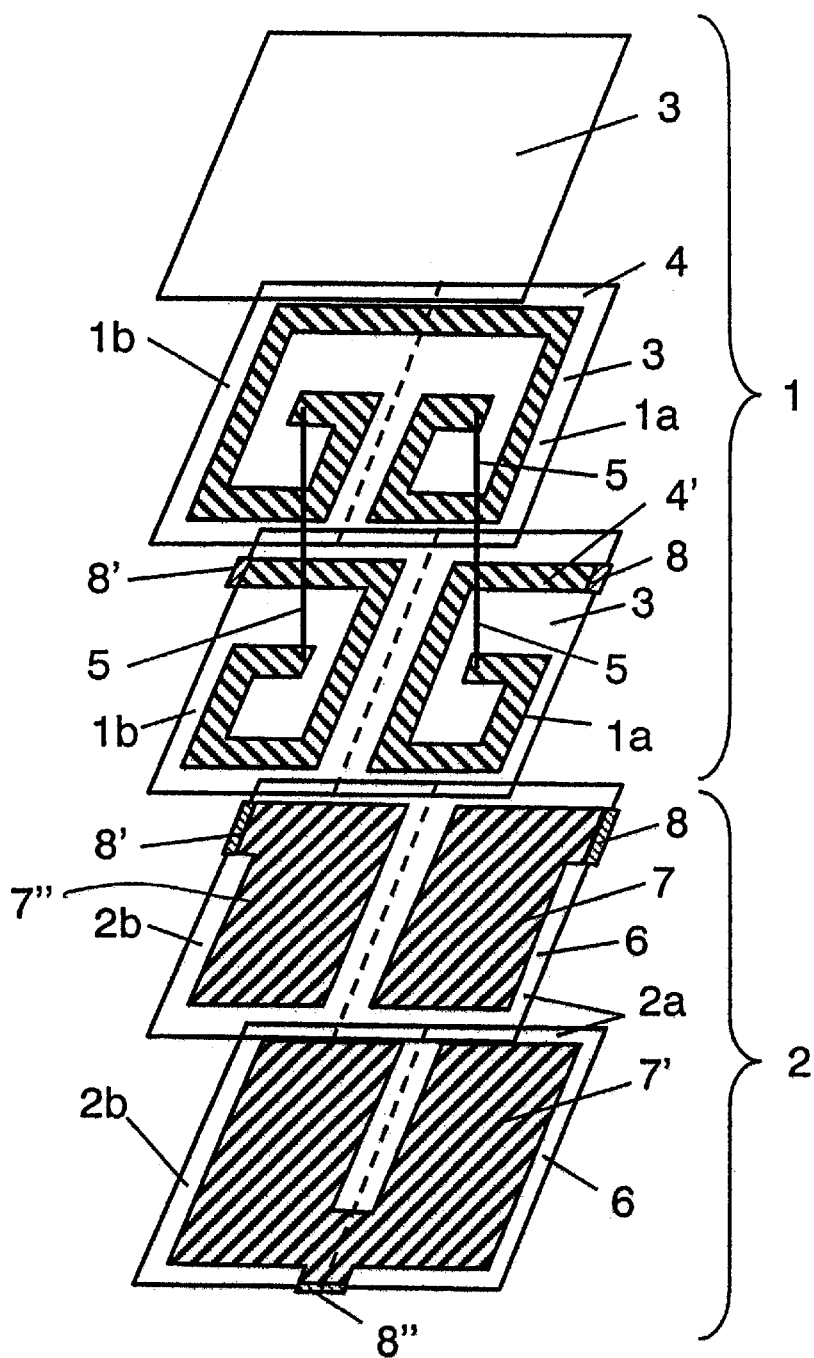
FIG. 5 is a schematic diagram showing a laminate structure of a composite component of a second embodiment of the invention.
Figure 6:
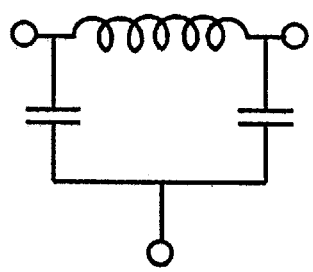
FIG. 6 is a diagram showing an equivalent circuit of the composite component of the second embodiment of the invention.

A composite component was manufactured in the same procedure as in the first embodiment of the invention except that the conductor 5' for electrically connecting the conductor layer 4' and the electrode layer 7 was excluded, and that the terminals 8,8' are connected to the two independent electrode layers 7,7" respectively. A schematic structure of this embodiment is shown in FIG. 5, and its equivalent circuit is given in FIG. 6. The composite part of the embodiment forms a π-type filter circuit.

Third Exemplary Embodiment

Figure 7:
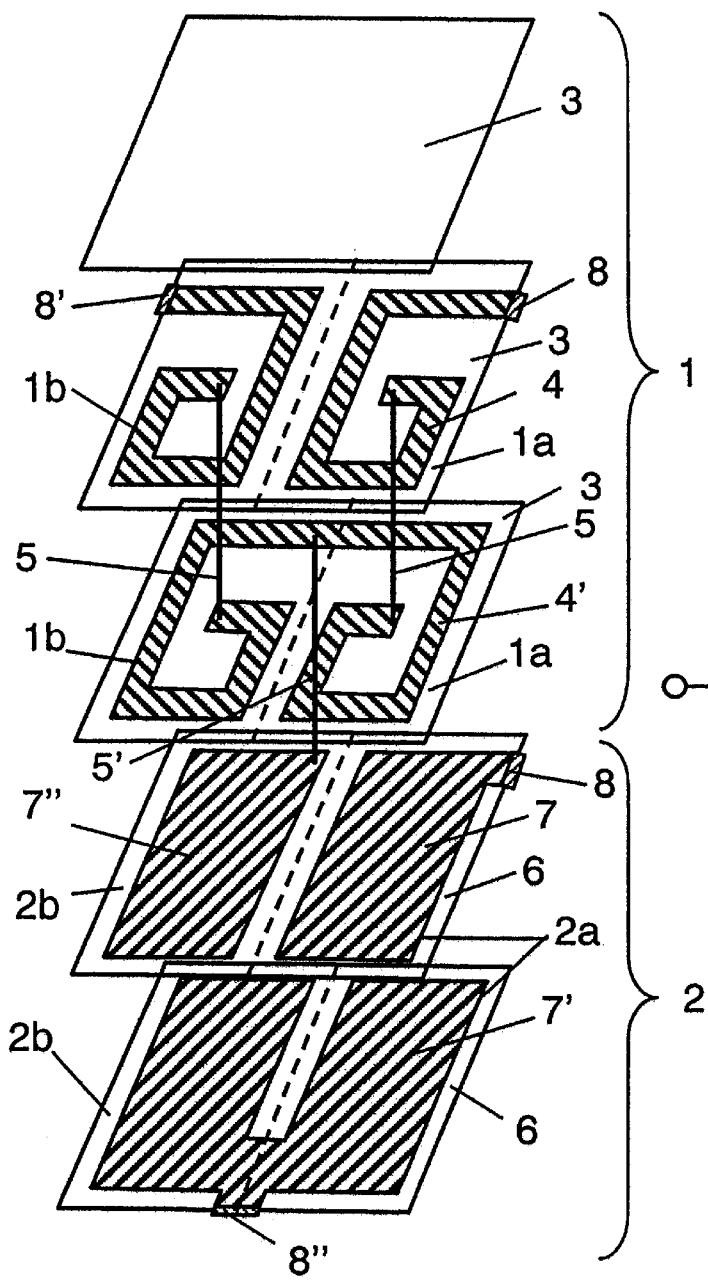
FIG. 7 is a schematic diagram showing a laminate structure of a composite component of a third embodiment of the invention.
Figure 8:
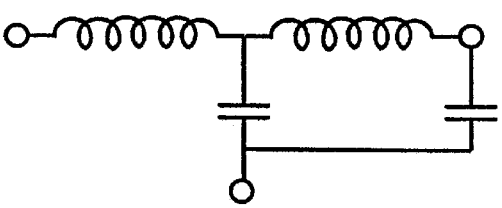
FIG. 8 is a diagram showing an equivalent circuit of the composite component of the third embodiment of the invention.

A composite component was manufactured in the same procedure as in the first embodiment of the -invention except that the electrode layer 7 was divided into two independent electrode layers 7, 7", and that the conductor layer 4' and the electrode layer 7" were electrically connected by the conductor 5'. A schematic structure of this embodiment is shown in FIG. 7, and its equivalent circuit is given in FIG. 8. The composite component of the embodiment forms an L-type two-stage filter circuit.

Fourth Exemplary Embodiment

Figure 9:
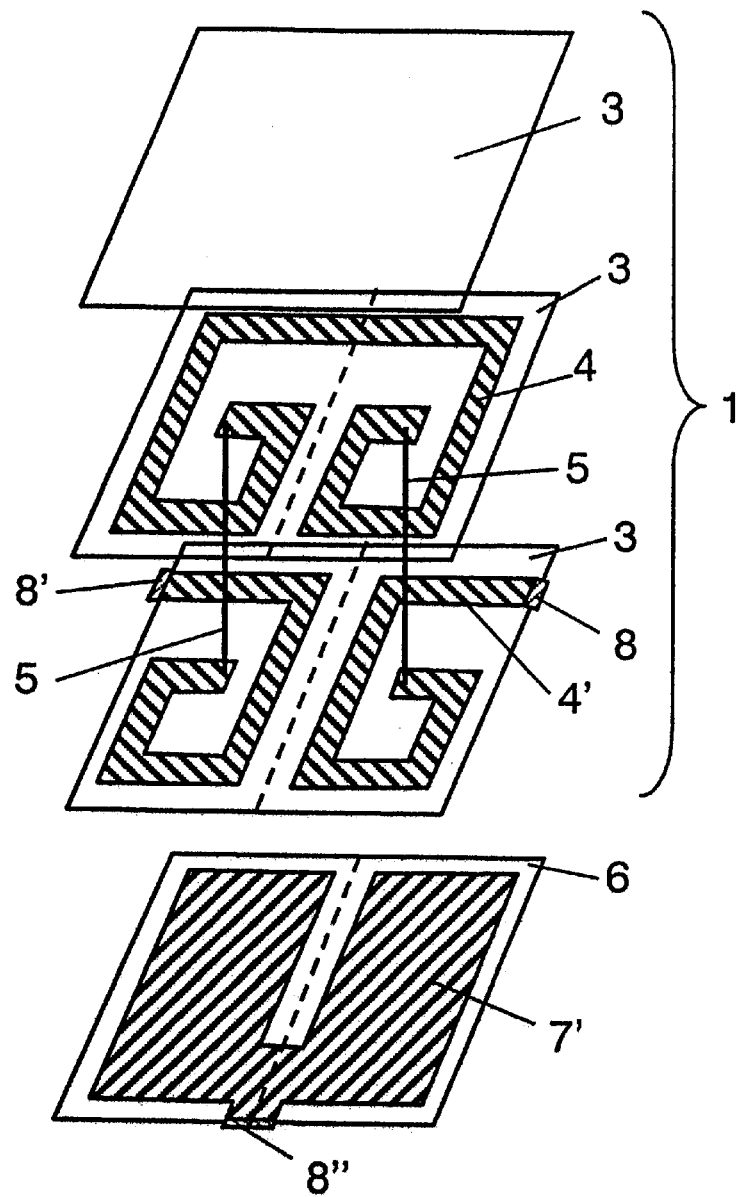
FIG. 9 is a schematic diagram showing a laminate structure of a composite component of a fourth embodiment of the invention.
Figure 10:
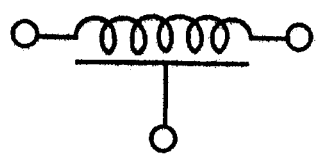
FIG. 10 is a diagram showing an equivalent circuit of the composite component of the fourth embodiment of the invention.

A composite component was manufactured in the same procedure as in the second embodiment of the invention except that the electrode layer 7 and the green sheet 6 having the electrode layer 7 were further excluded. A schematic structure of this embodiment is shown in FIG. 9, and its equivalent circuit is given in FIG. 10. The composite part of the embodiment forms a distributed capacitance type filter circuit.

As be understood from the above description and from FIG. 1 to FIG. 9, the conductor layers and electrode layers used in the first to fourth embodiments are similar in shape in the majority. And, hence, filters having various characteristics can be manufactured by slight change of the conductor layers or electrode layers. It can also be accomplished with the presence or absence of the through-hole conductor, or change of through-hole position in the components.

What is claimed is:

1. A sintered composite component comprising:

a coil conductor element comprising one coil on a surface of an insulating layer;

at least one capacitor element comprising a pair of electrode layers and a dielectric layer between said electrode layers;

a connecting conductor directly connecting the coil conductor element and the electrode layers of the capacitor element; and terminals connected to the coil conductor element and the capacitor element for connection to an external circuit.

2. The component of claim 1, wherein the coil conductor element comprises two coils formed by coil conductor elements on both a face surface and a back surface of said insulating layer with conductors connecting the two coil conductor elements to form the coils and wherein the two coils are formed at the junction where said connecting conductor directly connects to said coil conductor element.

3. The component of claim 1, wherein said at least one capacitor element comprises at least two capacitor elements, each comprising a pair of electrode layers and a common dielectric layer between said electrode layers and the two electrode layers on one side of the dielectric layer having independent electrical connectors for connecting to the coil conductor element.

4. The component of claim 1, wherein the coil conductor comprises at least two coils.

5. The component of claim 1, wherein the coil conductor comprises two coils, and there is only one capacitor element.

6. The component of claim 1, wherein the coil conductor comprises only one coil, and there are two capacitor elements, and the coil and the electrode layers of each capacitor element are directly connected.

7. The component of claim 1, wherein the coil conductor comprises two coils, there are two capacitor elements, and the coils of each conductor are directly connected.

8. The component of claim 1, wherein the insulator layer is a laminate joining the coil conductor and the electrode layers.

9. The component of claim 1, wherein the terminal is a multi-layer structure.

* * * * *